United States Patent [19]

Mekdhanasarn et al.

[11] Patent Number: 5,796,570

[45] Date of Patent: Aug. 18, 1998

[54] ELECTROSTATIC DISCHARGE PROTECTION PACKAGE

[75] Inventors: Boonmi Mekdhanasarn, Sunnyvale; Randy Hsiao-Yu Lo, Campbell; Steve M. Ichikawa, Fremont; Abdul Rahim Ahmed, Morgan Hill, all of Calif.

[73] Assignee: National Semiconductor Corporation, Santa Clara, Calif.

[21] Appl. No.: 724,305

[22] Filed: Sep. 19, 1996

[51] Int. Cl.$^6$ ........................................... H02H 1/00
[52] U.S. Cl. ........................ 361/126; 361/56; 361/91; 361/111
[58] Field of Search ........................ 361/56, 111, 117, 361/91, 127–129, 212, 220, 126

[56] References Cited

U.S. PATENT DOCUMENTS

| | | | |
|---|---|---|---|
| 4,477,827 | 10/1984 | Walker et al. | 257/670 |
| 4,559,579 | 12/1985 | Val | 361/220 |
| 4,617,605 | 10/1986 | Obrecht et al. | 361/220 |
| 4,819,047 | 4/1989 | Gilfeather et al. | 361/56 |
| 4,928,199 | 5/1990 | Diaz et al. | 361/56 |
| 5,147,822 | 9/1992 | Yamazaki et al. | 438/127 |
| 5,343,074 | 8/1994 | Higgins, III et al. | 257/668 |
| 5,444,593 | 8/1995 | Allina | 361/56 |
| 5,532,899 | 7/1996 | Tarbouriech | 361/126 |
| 5,550,402 | 8/1996 | Nicklaus | 257/669 |
| 5,552,951 | 9/1996 | Pasch et al. | 361/56 |
| 5,644,167 | 7/1997 | Weiler et al. | 257/777 |

*Primary Examiner*—Jeffrey A. Gaffin
*Assistant Examiner*—Michael Sherry
*Attorney, Agent, or Firm*—Beyer & Weaver, LLP

[57] ABSTRACT

Described is a circuit board having protection against electrostatic discharge. The board includes a plurality of interconnect traces and an electrically conductive ground plane formed on a substrate such that a gap is created between the interconnect traces and the ground plane. A resistive electrostatic discharge protection material is positioned to bridge the gaps between the ground plane and the interconnect traces, such that the electrostatic discharge protection material electrically insulates the interconnect traces from the ground plane at voltages below a predefined threshold voltage and establishes an electrical connection between the interconnect traces and the conductive plane at voltages above the threshold voltage. A process of manufacturing the circuit board includes forming interconnect traces and a ground plane such that there is a gap between the ground plane and the interconnect traces. A resistive electrostatic discharge protection material is placed in the gap between the ground plane and the traces for protection against electrostatic discharge. A package including the above described circuit board and a process of manufacturing such a package are also disclosed herein.

35 Claims, 5 Drawing Sheets

ELECTROSTATIC DISCHARGE PROTECTION PACKAGE

BACKGROUND OF THE INVENTION

This invention relates generally to circuit boards for use in packaged integrated circuits. More particularly it relates to circuit boards having electrostatic discharge (ESD) protection to reduce the likelihood of integrated circuit burnout in the event of an electrostatic discharge (ESD).

It is well known that the unavoidable and naturally occurring phenomenon of ESD can induce very high currents and voltage surges, which may exceed many thousands of volts. In the absence of any integrated circuit protection device, the current surge or overvoltage may penetrate an integrated circuit and cause hardware damage such as integrated circuit burnout or electronic malfunction, e.g. memory loss or loss of transmission data. Integrated circuits that are manufactured using the Metal Oxide Semiconductor (MOS) or similar technology may be considered, as an example of integrated circuits that may be rendered inoperable by ESD. As is well known to those of skill in the art, Metal Oxide Semiconductor (MOS) devices generally employ a gate structure, which includes an insulative thin film layer typically formed from silicon dioxide. Under overvoltage conditions that may be attributed to ESD, the thin film gate insulative layer may suffer from dielectric breakdown of potentials, for example, around 10 volts for a 0.35 micron process whereby the gate is shorted and the entire device is rendered inoperable. As the integrated circuit fabrication technology moves to smaller feature sizes designed to operate under lower current densities, the energy necessary to cause such damage is reduced even further.

In an effort to protect integrated circuits against overvoltage in general and by ESD in particular, manufacturers have incorporated a variety of circuit protection devices into chip designs. By way of example, one prior art integrated circuit package design that incorporates a circuit protection device is disclosed by U.S. Pat. No. 4,928,199 to Diaz et al. In this design, an integrated circuit package includes a die that is protected by a metallic cavity cover, which is connected to ground voltage and functions as ground plane. The circuit protection device, e.g. a glass layer, is placed on an interior surface of the cavity cover such that it contacts bonding wires, which connect bond pads on the die to leads on a lead frame.

Under normal operating conditions, the circuit protection device has high resistance. In response to a short voltage surge, however, the circuit protection device in a relatively short period of time is transformed from its high resistance state to a low resistance state. Soon after the short voltage surge comes to an end, the circuit protection device reverts back to its original high resistance state.

In the prior art integrated circuit package design mentioned above, a voltage surge generated from external circuitry entering into the integrated circuit package passes through the bonding wires, which are in contact with the circuit protection device. In response to the voltage surge, the circuit protection device transforms itself from a high resistance state to a low resistance state and conducts the voltage surge to the ground plane cavity cover. In this manner, the circuit protection device protects the die from a burnout that may result from a voltage surge generated at external circuitry. Although this design protects the die from voltage surges, it suffers from several drawbacks. Accordingly, improved integrated circuit package designs that provide adequate ESD protection utilizing an efficient process for manufacturing such a package design would be desirable.

SUMMARY OF THE INVENTION

To achieve the foregoing and other objectives and in accordance with the present invention, a circuit board having protection against electrostatic discharge is described. In a first embodiment of the present invention, the circuit board includes a plurality of interconnect traces and an electrically conductive ground plane formed on a substrate such that a gap is created between the interconnect traces and the ground plane. A resistive electrostatic discharge protection material is positioned to bridge the gap between the ground plane and the interconnect traces. The electrostatic discharge protection material electrically insulates the interconnect traces from the ground plane at voltages below a predefined threshold voltage and establishes an electrical connection between the interconnect traces and the conductive plane at voltages above the threshold voltage.

In another aspect of the invention, a packaged semiconductor device including the circuit board described above is also disclosed. The packaged semiconductor device includes a die attached to the circuit board, a plurality of bonding wires for electrically connecting bond pads on the die to associated traces, a lead frame and an encapsulation material that encapsulates the die, the circuit board, the bonding wires and at least a portion of the lead frame.

In yet another aspect of the invention, a process for making a circuit board having electrostatic discharge protection is also disclosed. The process includes forming interconnect traces and a ground plane on the substrate board such that a gap is formed between the ground plane and the interconnect traces. A resistive electrostatic discharge protection material is placed in the gap between the ground plane and the traces. The electrostatic discharge protection electrically insulates the traces from the ground plane at voltages below a predefined threshold voltage and establishes an electrical connection between the traces and the conductive plane at voltages above the threshold voltage. In one embodiment, the step of placing a electrostatic discharge protection material in the gap between the ground plane and the traces includes depositing a polymer solution of the electrostatic discharge protection material in the gap and curing the polymer solution in the gap.

In order to form the package described above, the process may further include mounting a die having a plurality of bond pads on the substrate board and electrically connecting the die to appropriate traces on the substrate board using a first set of bonding wires. Each bonding wire has a first end coupled to an associated bond pad and a second end coupled to an associated interconnect trace. The selected ones of the interconnect traces are electrically connected to associated leads of a lead frame. The die, bonding wires, and a portion of the lead are encapsulated to provide a protective package leaving exposed a portion of the leads to facilitate electrical connection of the die to external circuitry.

These and other advantages of the present invention will become apparent upon reading the following detailed description and studying the various figures of the drawings.

DETAILED DESCRIPTION OF THE PREFERRED EMBODIMENTS

The present invention relates to printed circuit boards (PCBs) that incorporate electrostatic discharge (ESD) protection devices to protect integrated circuits against a voltage surge that may be caused by an electrostatic discharge (ESD). Also, processes for manufacturing integrated circuit packaging containing the novel printed circuit boards (PCBs) is also disclosed. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
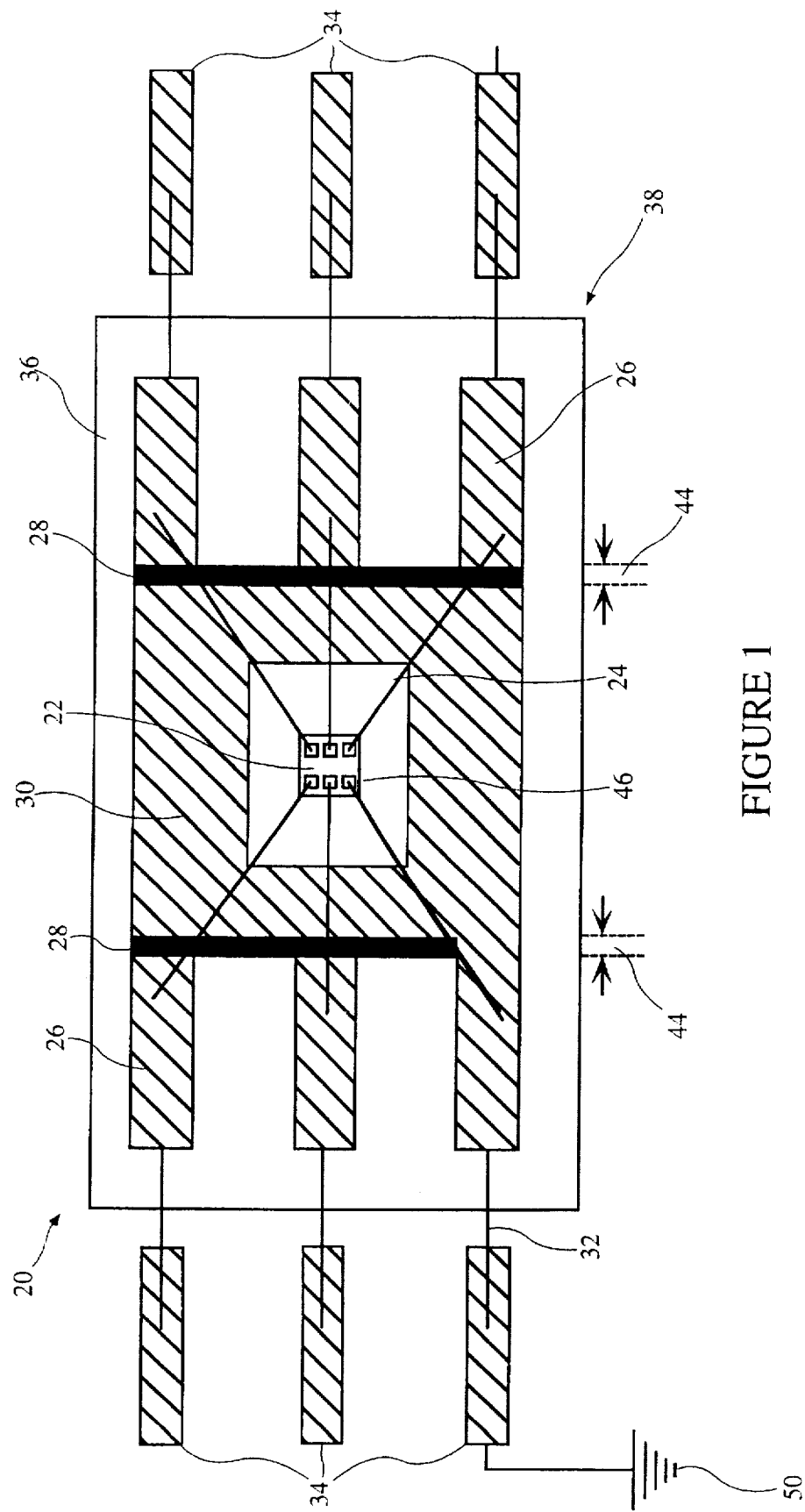
FIG. 1 is a top view of a packaged integrated circuit according to one embodiment of the present invention incorporating an ESD protection material therein.

Referring to FIG. 1, one embodiment of a packaged integrated circuit design containing a PCB which incorporates an ESD protection device according to the present invention is shown. A packaged integrated circuit 20 includes a PCB based substrate 36 in conjunction with a lead frame. PCB 38, which is discussed in detail hereinafter, is connected to leads 34 by a set of interconnect wires 32, i.e. interconnect wires 32 connect to a set of interconnect metal traces 26 on PCB 38 on one end and connect to a corresponding or associated leads 34 on the other end. Leads 34, in turn, are typically connected to external circuitry (not shown). As is well known to those of skill in the art, a package 20 is arranged to encapsulate the elements on PCB 38, the interconnect wires 32 and a portion of leads 34.

In one embodiment of the present invention, PCB 38 has a network of conductive interconnect metallic traces 26 disposed to the exterior of a discharge plane 30. Interconnect metallic traces 26 are separated from discharge plane 30 by a gap 44. As shown in FIG. 1, discharge plane 30 is connected to one of interconnect metallic traces 26 that is in turn connected to ground voltage 50 via one of interconnect wires 32 and one of leads 34. An ESD protection material 28 substantially fills or covers gap 44, which may extend the length of the discharge plane 30. ESD protection material 28 while in gap 44, physically contacts both interconnect metal traces 26 and discharge plane 30. Die 22, generally containing current sensitive circuitry, may be disposed at any suitable location on substrate 36 and/or inside the opening of discharge plane 30. Die 20 typically includes a plurality of bond pads 46, which connect to corresponding interconnect metal traces 26 via a set of bonding wires 24.

Figure 2:
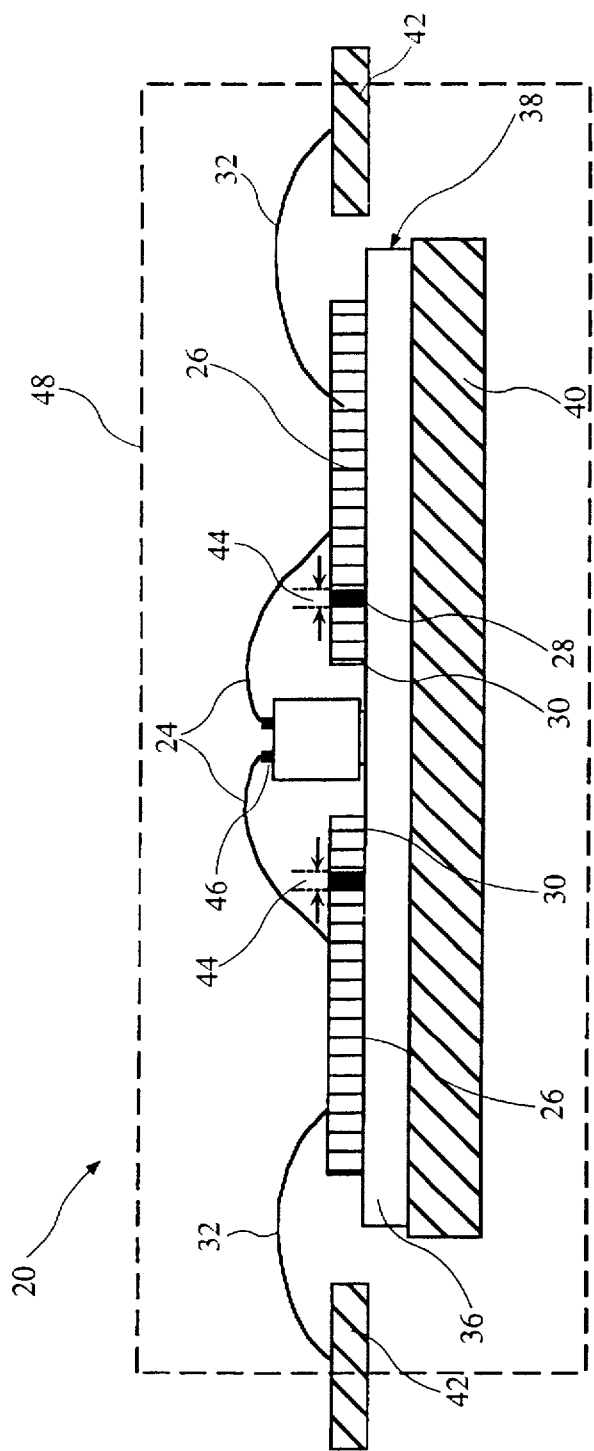
FIG. 2 is a side-sectional view of a cross-section of the package shown in FIG. 1.

Referring now to FIG. 2, a cross-sectional view of package 20 is shown to better illustrate the various components in one embodiment of the invention. Lead frame 42 includes a plurality of leads 34. PCB 38 is mounted on a suitable support such as lead frame paddle 40. Interconnect wires 32, interconnect metal traces 26 and bonding wires 24, bond pads 46, ESD protection material 28, gap 44 and die 22 appear in substantially the same configuration as shown in FIG. 1. In some embodiments, gap 44 appears as a cut or a channel region between interconnect metal traces 26 and discharge plane 30. ESD protection material 28, substantially fills the gap 44, thereby forming good electrical contacts with both the interconnect metal traces 26 and discharge plane 30. In one embodiment of the present invention, an encapsulating material 48 (shown by dashed lines) encapsulates a portion of package 20, e.g., the elements on PCB 38, interconnect wires 32 and a portion of leads 34.

When a voltage surge, which equals or exceeds the predefined threshold voltage of the ESD protection material 28, enters integrated circuit package 20 from a particular lead 34, it is conducted to associated trace 26 on PCB 38. In response to this voltage surge, ESD protection material 28, which is electrically connected to traces 26, transforms from its normally high resistance state to a low resistance state. ESD protection material 28, in this state of low resistance, substantially conducts the voltage surge to discharge plane 30, wherefrom the voltage surge is shunted to ground. In this manner, ESD protection material 28 protects the sensitive circuit components of die 22 from possible burnout by ESD. As soon as the short voltage surge comes to an end, the ESD protection material 28 reverts back to its normal state of high resistance.

It should be noted that although package 20, as shown in FIGS. 1 and 2, shows a single chip module assembly, the present invention is not limited to single die configurations. Rather, the single die configuration detailed above is used as an example to illustrate the simplicity of a packaged integrated circuit design according to the present invention and its advantages over the prior art. In fact, the described invention applies equally well to multi-chip module assemblies.

Similarly, PCB 38, as envisioned in the present invention, is not limited to a packaged integrated circuit only. It may be effectively incorporated in other electrical devices, such as PCBs populated with various electrical components. Components of PCB 38 are generally disposed above a substrate board 36, which is well known to those skilled in the art. Leads 34, wires 32 and bonding wires 24, bond pads 46, interconnect metal traces 26, discharge plane 30 (all as shown in FIG. 1) and lead frame 42, lead frame paddle 40 (both as shown in FIG. 2) may be constructed from materials well known to those skilled in the art. Die 22 generally refers to a chip or an integrated circuit or any electrical device that may contain circuitry sensitive to a voltage surge.

Discharge plane 30, as shown in FIG. 1, may serve as a grounded electrically conductive plane. In other embodiments of the present invention, however, a variety of other devices can serve as the grounded electrically conductive plane. Examples of such devices include the die attach area itself, a conductive sheet, or a metal trace of almost any geometry, such as a substantially ring shaped metal trace. As will be appreciated by those skilled in the art that the present invention is also not limited to a single grounded electrically conductive plane and that the present invention can include a plurality of such planes. Furthermore, the connection of the electrically conductive plane, such as a discharge plane 30, to ground voltage is not limited to the configuration as shown in FIG. 1, i.e. via one of interconnect metallic traces 26, wires 32, and leads 34. Of course, such a connection to ground voltage can be made any number of ways well known to those skilled in the art.

Gap 44 is generally defined by the space between interconnect metallic traces and the electrically conductive plane. It may take a variety of different shapes and sizes. Some examples of the gap shape include a grooved, depression or a channel region on the metallization, or simply a void space on the substrate. For illustration purposes, FIG. 2 shows one embodiment of the present invention where the gap may be a cut or a channel region between interconnect metallic traces 26 and discharge plane 30. Although the gap width may be of any suitable size, it is preferable to have the gap not exceed the gap depth. The dimensions of the gap depth may generally range from between about 0.5 mils to about 5 mils. The dimensions of the gap width may generally range from between about 0.25 to about 5 mils, preferably range from between about 0.5 to about 1.5 mils and more preferably be about 1 mils.

ESD protection material 28 may generally include any suitable resistive current sensitive material that is capable of significantly conducting electricity at a predefined threshold voltage. ESD protection material 28, however, preferably includes polymers, which may be employed in the present invention in the form of a solid strip or a solution. By way of example, a polymer strip called Surg X™, available from Surg X, of Fremont, Calif.

Sufficient amount of ESD protection material 28 in any form, i.e. as a polymer solution or strip, may be deposited on the gap so long as it establishes a solid contact between the interconnect metal traces and electrically conductive plane and at the predefined threshold voltage effectively conducts the voltage surge shunting it to ground. In embodiments of the present invention, however, where a void space on the substrate serves as the gap, it is preferable to have the polymer strip adhering to the gap, e.g. the polymer strip may have an adhesive backing that helps it adhere to the gap. Additionally, in embodiments of the present invention, where a grooved, channel or depression region serves as the gap, it is preferable to apply the polymer solution by methods discussed hereinafter.

The threshold voltage required to transform the normally resistive ESD protection material 28 to a substantially conductive material may vary to a great extent in accordance with the needs of a particular system. By way of example, threshold voltage in a range from between about 10 to about 500 volts will be appropriate in most conventional packaging arrangements. Threshold voltages in the range of about 10 to about 100 volts and more preferably ranges from between about 10 to about 50 volts.

Figure 5:
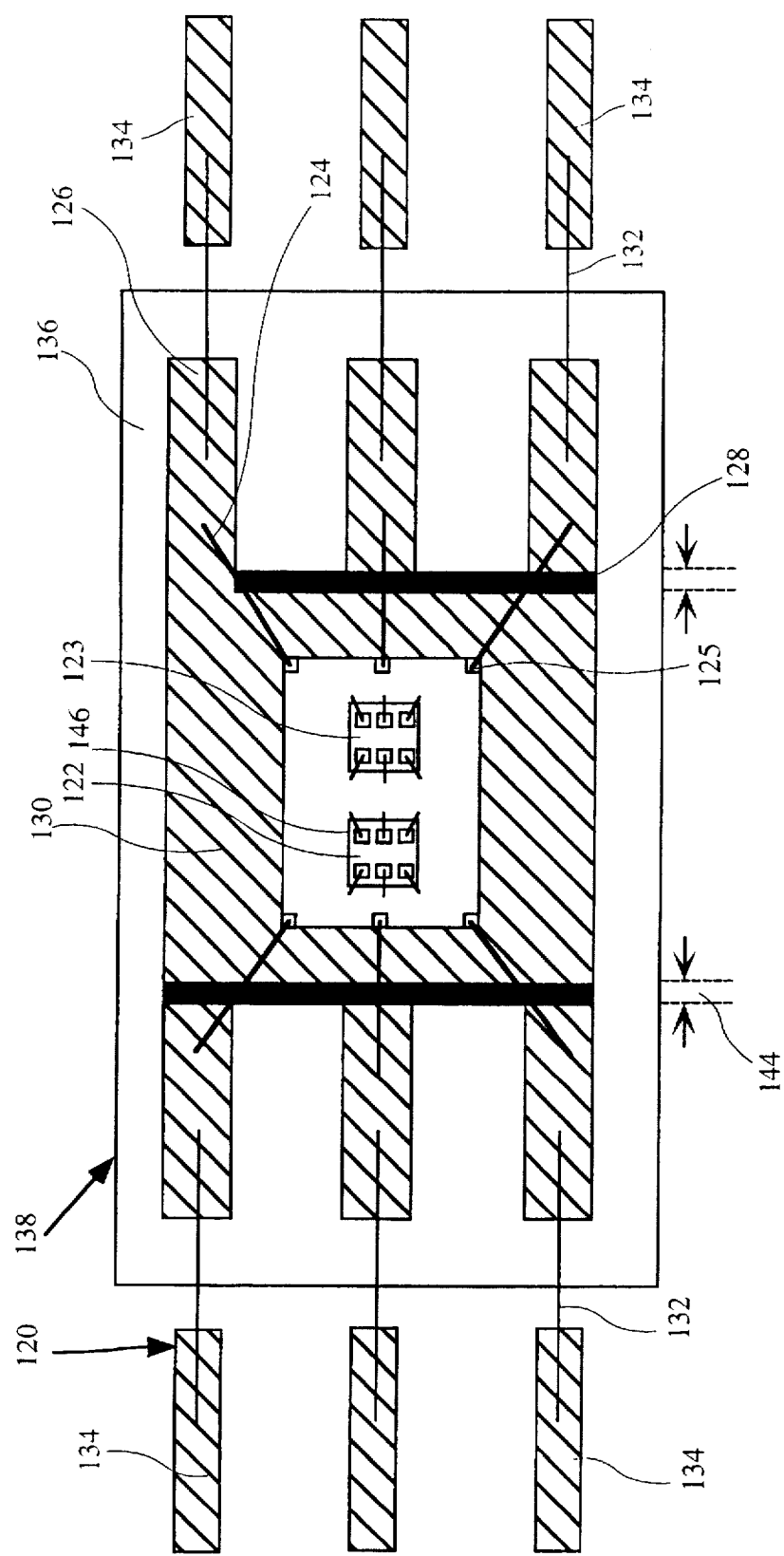
FIG. 5 is a top view of a packaged integrated circuit according to another embodiment of the present invention incorporating ESD protection material therein for a multi-chip module assembly.

FIG. 5 shows a multi-chip module assembly 120 including a PCB 138 that is attached to a plurality of leads 134 via a set of interconnect wires 132. PCB 138 includes a first and second die 22 and 23 disposed at any suitable location on substrate 136 and/or inside the opening of a discharge plane 130. Die 22 and 23 include a plurality of bond pads 146, which connect to circuitry (not shown to simplify illustration) beneath substrate 136 and this circuitry in turn connects to a plurality of connection points 125 that connect to interconnect metal traces 126 via a set of bonding wires 124. As shown in FIG. 5, interconnect traces 126 and discharge plane 130 are arranged to form a gap 144, which is filled with ESD protection material 128. Those skilled in the art will recognize that an encapsulating material 148 encapsulates elements on PCB 138, interconnect wires 132 and a portion of the leads 134.

Figure 3:
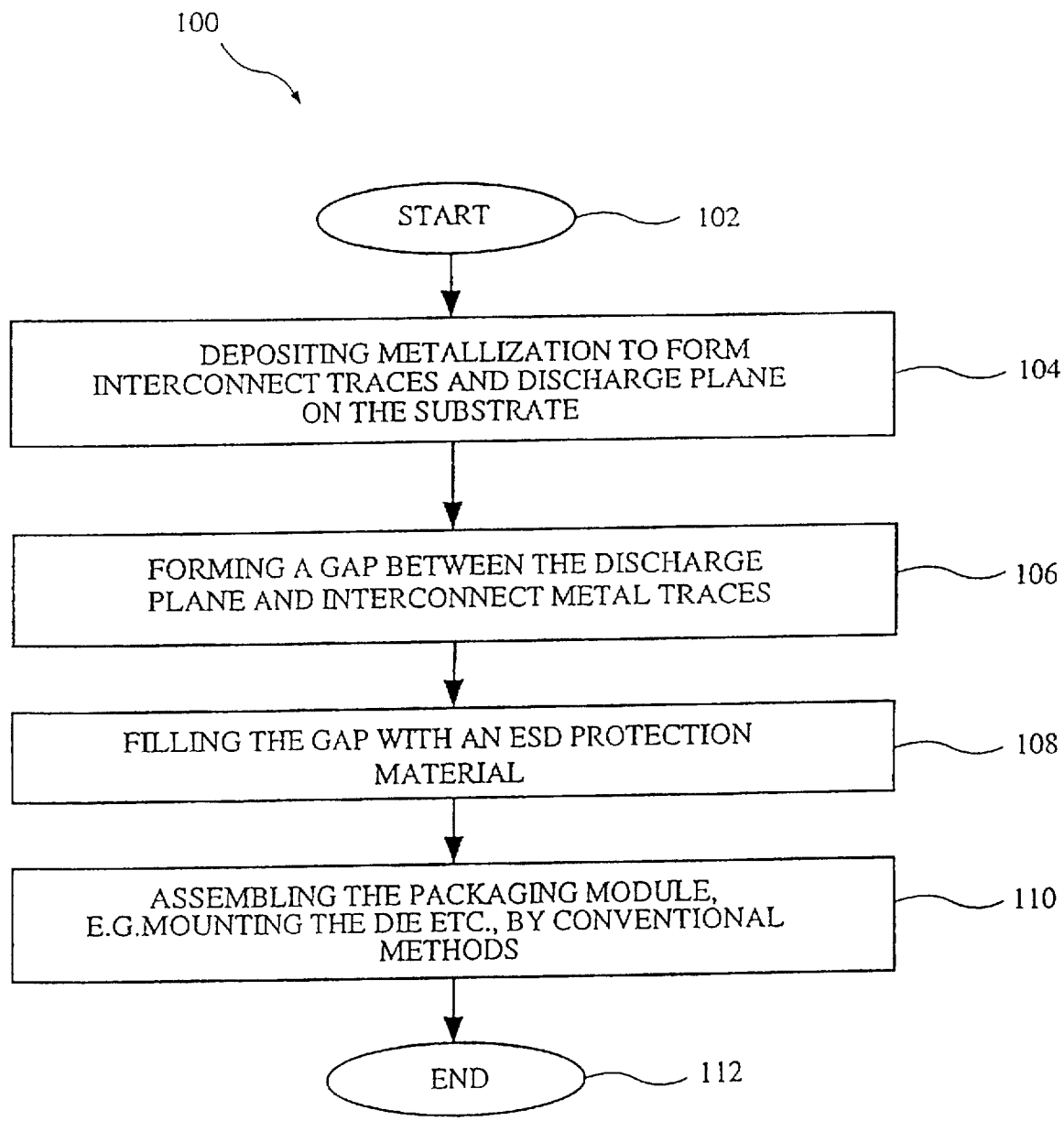
FIG. 3 is a flowchart of a process of packaging an integrated circuit that incorporates an ESD protection material therein according to one embodiment of the present invention.

Referring now to FIG. 3, process 100 for packaging an integrated circuit utilizing a packaging structure that incorporates an ESD protection material according to the present invention will be described. In step 102 any necessary pre-fabrication steps that are required to prepare a substrate for metallization are performed, i.e. preheating the substrate, etc... In step 104, metallization is deposited on the substrate to form a network of interconnect traces and a discharge plane. In one embodiment of the present invention, the network of traces may be arranged such a way that a die attach area is defined near or at about the center of the substrate. The deposition of the traces and discharge plane are accomplished by conventional deposition methods well known to those skilled in the art and in one embodiment include printing the metallization directly on the substrate. In one embodiment, the die attach area is simply a void area at about the center of the substrate.

In step 106, a gap between the traces and the discharge plane is formed in any number of ways well known in the art. In one embodiment, the gap is formed by cutting into the metallization after the metallization has been printed on the substrate. Cutting into metallization may be accomplished by any method well known to those skilled in the art and in one embodiment of the present invention it includes etching the metallization by conventional photolithography techniques. In an alternative embodiment, the traces and the discharge plane are printed in the appropriate locations in step 104 such that they are separated by a gap. In such arrangements, a separate gap forming step is not required. In yet another embodiment, steps 104 and 106 of the present invention may be carried out by etching a conductive layer, e.g. metallization, of the substrate board to form the network of interconnect traces, a discharge plane and the gap. The substrate board in this embodiment may include a laminated structure.

In step 108, an ESD protection material is placed in the gap. This may be accomplished in a variety of ways as will be appreciated by those skilled in the art. By way of example, in one embodiment, an ESD protection tape is applied in the gap between the interconnect metallic traces and the discharge plane. Alternatively, deposition may take place by screen or transfer printing the ESD protection material on the gap or by dispensing the ESD protection material in solution form through a nozzle on the gap. The different forms of ESD protection material complementing the different gap shapes are discussed in detail hereinabove. In those embodiments of the present invention, where a polymer solution is preferable as an ESD protection material, gap dimensions may dictate the amount of ESD protection material that is ultimately present or deposited. As already mentioned, the amount of ESD protection material provided in the gap should be sufficient to facilitate a reliable, solid contact between the interconnect metallic traces and the electrically conductive plane and to significantly conduct a voltage surge that equals or exceeds the predefined threshold voltage. Thus, the various workable gap widths have been discussed hereinabove in detail. It should be apparent that the discharge voltage for a particular ESD material can be quite accurately controlled by controlling the gap width, which is easy to do using conventional tooling.

In step 110, the package is assembled according to conventional steps well known to those skilled in the art. These steps may include, for example, mounting one or more dies having a plurality of bond pads on the associated die attach areas, connecting a set of bonding wires to associated bonding pads of the dies on one and to associated interconnect metal traces on the other end, mounting the PCB on a lead frame paddle, connecting a set of interconnect wires to associated interconnect metal traces on one end and to associated leads on the lead frame on the other end and encapsulating a portion of the package, e.g. the elements on PCB, interconnect wires and a portion of the leads. In one embodiment, most of these steps may be carried out in a Multi Chip Module Die Attach System, such as the Kulicke & Soffa Model 6990, available from the Kulicke & Soffa, of Willow Grove, Pennsylvania. Process 100 comes to an end in step 112, which typically includes post assembly steps which are well known to those skilled in the art.

Figure 4:
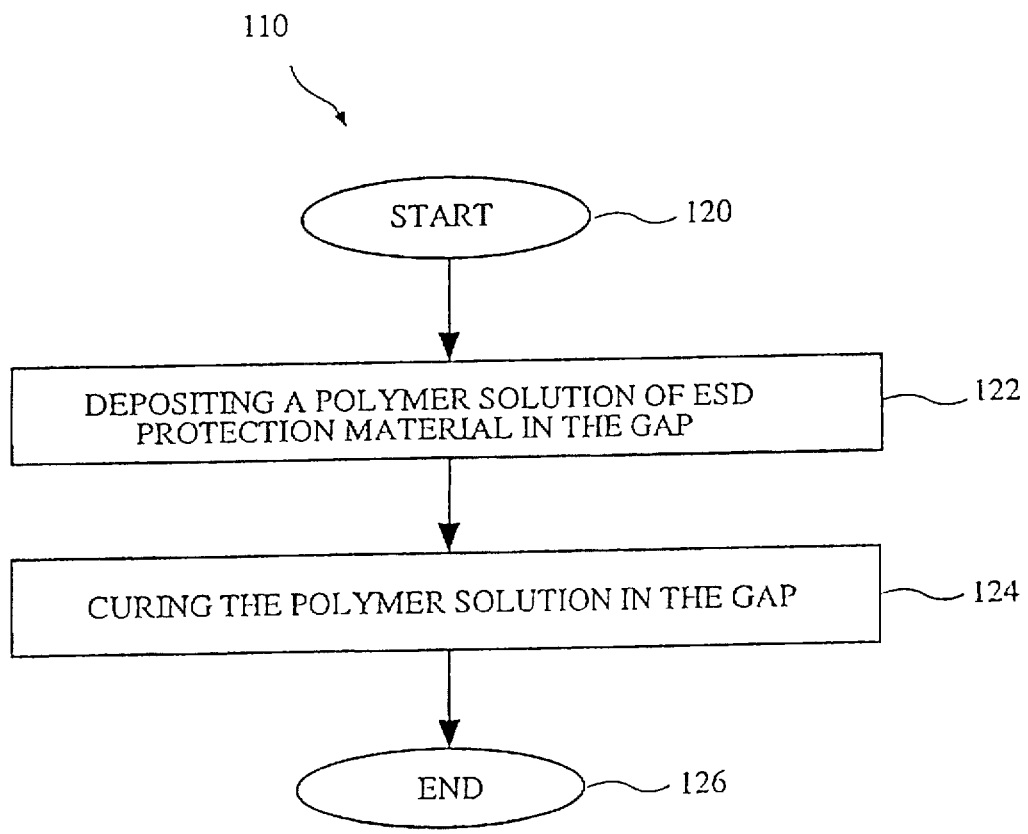
FIG. 4 is a flowchart illustrating one implementation of step 110, as described in FIG. 3, and shows an alternative method of providing the ESD protection material inside a gap shown in FIGS. 1 and 2.

Referring now to FIG. 4, which is a variant of step 110 in one embodiment of the present invention. Step 110, as shown in FIG. 3, refers to a step of providing ESD protection material in the gap. In FIG. 4, step 110 of the present invention begins at step 120. In step 122, an ESD protection material in polymer solution form is deposited in the gap between the interconnect metal traces and the electrically conductive plane. In step 124, the polymer solution undergoes curing, which typically includes heat treatment of the polymer material. The curing temperature depends on whether the polymer solution is a low temperature or a high temperature polymer. Curing the polymer solution is, however, generally conducted at a temperature of between about 100° and about 500° C., preferably conducted at a temperature of between about 100° and about 200° C., and more preferably conducted at a temperature of between about 100° and about 150° C. In step 126, step 110 comes to an end and one embodiment of the inventive process may continue as described in FIG. 3.

While this invention has been described in terms of several preferred embodiments, there are alterations, permutations, and equivalents which fall within the scope of this invention. It should also be noted that there are many alternative ways of implementing the methods and apparatuses of the present invention, e.g. the present invention's protection against ESD will be just as effective in other applications where there is a different source responsible for a voltage surge. It is therefore intended that the following appended claims be interpreted as including all such alterations, permutations, and equivalents as fall within the true spirit and scope of the present invention.

What is claimed is:

1. A circuit board, the circuit board having protection against electrostatic discharge (ESD), comprising:
    a substrate suitable for supporting a die;
    a plurality of interconnect traces formed on the substrate;
    an electrically conductive ground plane formed on said substrate such that the ground plane is substantially co-planer with the interconnect traces, the ground plane being arranged such that a gap is created between the interconnect traces and the ground plane; and
    a resistive electrostatic discharge (ESD) protection material positioned to bridge the gap between the ground plane and the interconnect traces in a substantially co-planer manner, without substantially covering the interconnect traces or the electrically conductive ground plane, wherein said ESD protection material is arranged to electrically insulate the interconnect traces from the ground plane at voltages below a predefined threshold voltage and to establish an electrical connection between said interconnect traces and said conductive plane at voltages above the threshold voltage.

2. The circuit board of claim 1, further comprising a die attach area suitable for connecting to ground voltage, wherein ESD protection material is between the traces and the die attach area.

3. The circuit board of claim 1, further comprising a die attach area on the substrate, wherein said conductive plane takes the form of a substantially ring shaped metal trace around the die attach area.

4. The circuit board of claim 1, wherein said ESD protection material takes the form of a strip of polymer tape.

5. The circuit board of claim 1, wherein the predefined threshold voltage ranges between about 10 and about 500 volts.

6. The circuit board of claim 5, wherein said predefined threshold voltage ranges between about 10 and about 100 volts.

7. The circuit board of claim 6, said predefined threshold voltage ranges between about 10 and about 50 volts.

8. The circuit board of claim 1, wherein the width of said gap ranges between about 0.25 and about 5 mils.

9. The circuit board of claim 8, wherein the width of said gap ranges between about 0.5 and about 1.5 mils.

10. The circuit board of claim 1, wherein the depth of said gap ranges between about 0.5 and about 5 mils.

11. The circuit board of claim 10, wherein the width of said gap does not exceed the depth of said gap.

12. A packaged semiconductor device, comprising:
    a circuit board including:
        a plurality of interconnect traces formed on the substrate;
        an electrically conductive ground plane formed at least partially adjacent the die attach area such that the ground plane is substantially co-planer with the interconnect traces, the ground plane being arranged such that a gap is created between the interconnect traces and the ground plane; and
        a resistive electrostatic discharge (ESD) protection material positioned to bridge the gap between the ground plane and the interconnect traces, wherein said ESD protection material is arranged to electrically insulate the interconnect traces from the ground plane at voltages below a predefined threshold voltage and to establish an electrical connection between said interconnect traces and said conductive plane at voltages above the threshold voltage;
    a die having a plurality of bond pads and attached to a die attach area on the circuit board;
    a plurality of bonding wires electrically connecting associated ones of the bond pads to associated ones of the traces;
    a plurality of leads disposed outside the circuit board and suitable for connection to external circuitry;
    a plurality of wires electrically connecting associated ones of said interconnect metal traces to associated ones of said leads; and
    an encapsulation material encapsulating a portion of the packaged semiconductor and leaving exposed a portion of the leads to facilitate electrical connection to external circuitry.

13. A packaged semiconductor device as recited in claim 12 that takes the form of a multi-chip module, the multi-chip module including a plurality of dies attached to the circuit board in the die attach area.

14. A process for making a circuit board having ESD protection, the method comprising the steps of:
    forming a plurality of interconnect traces on a substrate board;
    forming a ground plane around a die attach area on the substrate board such that a gap is formed between the ground plane and the interconnect traces; and
    placing a resistive ESD protection material in the gap between the ground plane and the traces, wherein said ESD protection material is arranged to electrically insulate the traces from the ground plane at voltages below a predefined threshold voltage and to establish an electrical connection between said traces and said conductive plane at voltages above the threshold voltage.

15. A process as recited in claim 14, further comprising the steps of:

mounting a die on the die attach area, the die including a plurality of bond pads;

electrically connecting the die to appropriate traces on the substrate board using a first set of bonding wires, each bonding wire having a first end coupled to an associated bond pad and a second end coupled to an associated interconnect trace;

electrically connecting selected ones of the interconnect traces to associated leads of a lead frame; and encapsulating the die, the bonding wires, and a portion of the leads to provide a protective package and leaving exposed a portion of the leads to facilitate electrical connection of the die to external circuitry.

16. The process of claim 14, wherein said step of forming the interconnect traces comprises printing the interconnect traces on the substrate.

17. The process of claim 16, wherein said step of forming the interconnect traces further comprises cutting into a portion of the interconnect traces to define said gap.

18. The process of claim 14, wherein said steps of forming the interconnect traces and forming the ground plane include etching a conductive layer of the substrate board to form the interconnect metal traces, ground plane and gap.

19. The process of claim 14, wherein said step of forming a ground plane comprises one step selected from the group consisting of forming at least one substantially ring shaped ground trace, electrically connecting the die attach area to ground voltage, or electrically connecting one of the leads in electrical connection with the ground plane to ground voltage.

20. The process of claim 14, wherein said step of placing the ESD protection material comprises one step selected from the group consisting of transfer printing the ESD protection material on the gap, screen printing the ESD protection material on the gap or dispensing the ESD protection material through a nozzle on the gap.

21. The process of claim 14, wherein said step of placing the ESD protection material further comprises:

depositing a polymer solution of the ESD protection material in the gap;

curing the polymer solution in the gap.

22. The process of claim 21, wherein said step of curing said ESD protection material comprises heat treating said ESD protection material at a temperature ranges between about 100° and about 500° C.

23. The process of claim 22, wherein said temperature ranges between about 100° and about 200° C.

24. The process of claim 23, wherein said temperature ranges between about 100° and about 150° C.

25. A circuit board having protection against electrostatic discharge (ESD), comprising:

a substrate having a die support area suitable for supporting a die;

a plurality of interconnect traces formed on the substrate;

an electrically conductive ground plane formed on said substrate at least partially adjacent the die support area, the ground plane being arranged such that a gap is created between the interconnect traces and the ground plane; and a resistive electrostatic discharge (ESD) protection material positioned to bridge the gap between the ground plane and the interconnect traces, wherein said ESD protection material is arranged to electrically insulate the interconnect traces from the ground plane at voltages below a predefined threshold voltage and to establish an electrical connection between said interconnect traces and said conductive plane at voltages above the threshold voltage.

26. The circuit board of claim 25, wherein the electrically conductive ground plane covers the die support area on the substrate thereby forming an electrically grounded die attach area for the die.

27. The circuit board of claim 25, wherein the electrically conductive ground plane forms a ring about the die support area.

28. The circuit board of claim 25, wherein said ESD protection material takes the form of a strip of polymer tape.

29. The circuit board of claim 25, wherein the predefined threshold voltage ranges between about 10 and about 500 volts.

30. The circuit board of claim 25, wherein said predefined threshold voltage ranges between about 10 and about 100 volts.

31. The circuit board of claim 27, wherein said predefined threshold voltage ranges between about 10 and about 50 volts.

32. The circuit board of claim 25, wherein the width of said gap ranges between about 0.25 and about 5 mils.

33. The circuit board of claim 25, wherein the width of said gap ranges between about 0.5 and about 1.5 mils.

34. The circuit board of claim 30, wherein the depth of said gap ranges between about 0.5 and about 5 mils.

35. The circuit board of claim 30, wherein the width of said gap does not exceed the depth of said gap.

* * * * *